United States Patent [19]

Horsley

[11] Patent Number: 5,260,693
[45] Date of Patent: Nov. 9, 1993

[54] METHOD AND SYSTEM FOR LOSSLESS AND ADAPTIVE DATA COMPRESSION AND DECOMPRESSION

[75] Inventor: Erik R. Horsley, Seattle, Wash.

[73] Assignee: SpaceLabs Medical, Inc., Redmond, Wash.

[21] Appl. No.: 776,064

[22] Filed: Oct. 11, 1991

[51] Int. Cl.⁵ ............................................. H03M 7/40
[52] U.S. Cl. ....................................... 341/67; 341/76; 341/63
[58] Field of Search ........................ 341/65, 67, 76, 77, 341/63

[56] References Cited

U.S. PATENT DOCUMENTS

| | | | |
|---|---|---|---|
| 4,546,342 | 10/1985 | Weaver et al. | 341/51 |
| 4,578,704 | 3/1986 | Gharavi | 341/107 |
| 4,626,829 | 12/1986 | Hauck | 341/107 |
| 4,734,768 | 3/1988 | Pexa | 341/63 |
| 4,781,096 | 11/1988 | Suzuki et al. | 84/1.01 |
| 4,813,056 | 3/1989 | Fedele | 341/107 |
| 4,839,649 | 6/1989 | Imai et al. | 341/65 |

OTHER PUBLICATIONS

Held, Gilbert, *Data Compression Techniques and Applications, Hardware and Software Considerations*, Second Edition, John Wiley & Sons, 1983, pp. 92-117.
Apiki, Steve, "Lossless Data Compression," *BYTE*, Mar. 1991, pp. 309-314, 386-387.
Baran, Nick, "Putting the Squeeze on Graphics," *BYTE*, Dec. 1990, pp. 289-294.
Bell, Timothy, et al., "Modeling for Text Compression," *ACM Computing Surveys*, vol. 21, No. 4, Dec. 1989, pp. 557-591.
Vaughan-Nichols, Steve J., "Saving Space," *BYTE*, Mar. 1990, pp. 237-243.
Hirschberg, Daniel S. and Debra A. Lelewer, "Efficient Decoding of Prefix Codes," *Communications of the ACM*, vol. 33, No. 4, Apr. 1990, pp 449-457.

*Primary Examiner*—Howard L. Williams
*Attorney, Agent, or Firm*—Seed and Berry

[57] ABSTRACT

A method and system for compression and decompression. The system compresses data by calculating the differences between adjacent data values, identifying a plurality of frequently occurring differences, tracking the frequency of occurrence of the identified differences, generating a first encoding for the identified differences wherein the length of the encoding is based on the frequency of occurrence, generating a second encoding for the differences other than the identified differences, and for each calculated difference, encoding the calculated difference is identified difference and encoding the calculated difference using the second encoding when the calculated difference is not an identified difference to effect the compression of the data.

18 Claims, 15 Drawing Sheets

Figure 3

| | Value 301 | | Value 302 | | Count 303 |
|---|---|---|---|---|---|
| 0 | 33 | | 0 | | 24407 |
| 1 | 32 | | 17 | | 23576 |
| 2 | 31 | | 1 | | 18282 |
| 3 | 30 | | -1 | | 13648 |
| 4 | 25 | | 3 | | 10197 |
| 5 | 24 | | -2 | | 5537 |
| 6 | 22 | | 2 | | 5514 |
| 7 | 20 | | 4 | | 4473 |
| 8 | 19 | | -3 | | 3278 |
| 9 | 17 | | 5 | | 2878 |
| 10 | 15 | | 6 | | 1748 |
| 11 | 13 | | -4 | | 1684 |
| 12 | 11 | | 7 | | 1344 |
| 13 | 8 | | -5 | | 1282 |
| 14 | 5 | | 8 | | 1142 |
| 15 | 3 | | -6 | | 1032 |
| 16 | 0 | | 9 | | 997 |
| 17 | 2 | | -7 | | 966 |
| 18 | 6 | | 10 | | 838 |
| 19 | 4 | | -8 | | 763 |
| 20 | 7 | | -9 | | 758 |
| 21 | 9 | | 11 | | 656 |
| 22 | 10 | | -10 | | 648 |
| 23 | 12 | | 12 | | 588 |
| 24 | 14 | | -11 | | 567 |
| 25 | 16 | | -12 | | 507 |
| 26 | 18 | | 13 | | 505 |
| 27 | 21 | | 15 | | 487 |
| 28 | 23 | | 16 | | 474 |
| 29 | 26 | | 14 | | 472 |
| 30 | 29 | | -13 | | 423 |
| 31 | 27 | | -14 | | 330 |
| 32 | 28 | | -15 | | 304 |
| 33 | 1 | | -16 | | 298 |

Figure 4

| | BitPattern 401 | Size 402 |
|---|---|---|
| 0 | 00 | 2 |
| 1 | 01 | 2 |
| 2 | 100 | 3 |
| 3 | 101 | 3 |
| 4 | 1100 | 4 |
| 5 | 11010 | 5 |
| 6 | 11011 | 5 |
| 7 | 11100 | 5 |
| 8 | 111010 | 6 |
| 9 | 1110110 | 7 |
| 10 | 1110111 | 7 |
| 11 | 1111000 | 7 |
| 12 | 1111001 | 7 |
| 13 | 11110100 | 8 |
| 14 | 11110101 | 8 |
| 15 | 11110110 | 8 |
| 16 | 11110111 | 8 |
| 17 | 1111100 | 7 |
| 18 | 111110100 | 9 |
| 19 | 111110101 | 9 |
| 20 | 111110110 | 9 |
| 21 | 111110111 | 9 |
| 22 | 11111100 | 8 |
| 23 | 111111010 | 9 |
| 24 | 1111110110 | 10 |
| 25 | 1111110111 | 10 |
| 26 | 111111100 | 9 |
| 27 | 111111101 | 9 |
| 28 | 111111110 | 9 |
| 29 | 1111111110 | 10 |
| 30 | 11111111110 | 11 |
| 31 | 111111111110 | 12 |
| 32 | 1111111111110 | 13 |
| 33 | 1111111111111 | 13 |

Figure 5

Tree

| Leaf | Value | Offset |
|---|---|---|
| 0 | 0 | 4 |
| 1 | 0 | 2 |
| 2 | 1 | 0 |
| 3 | 1 | 17 |
| 4 | 0 | 4 |
| 5 | 0 | 2 |
| 6 | 1 | 1 |
| 7 | 1 | -1 |
| 8 | 0 | 6 |
| 9 | 0 | 2 |
| 10 | 1 | 3 |
| 11 | 0 | 2 |
| 12 | 1 | -2 |
| 13 | 1 | 2 |
| 14 | 0 | 8 |
| 15 | 0 | 2 |
| 16 | 1 | 4 |
| 17 | 0 | 2 |
| 18 | 1 | -3 |
| 19 | 0 | 2 |
| 20 | 1 | 5 |
| 21 | 1 | 6 |
| 22 | 0 | 12 |
| 23 | 0 | 4 |
| 24 | 0 | 2 |
| 25 | 1 | -4 |
| 26 | 1 | 7 |
| 27 | 0 | 4 |
| 28 | 0 | 2 |
| 29 | 1 | -5 |
| 30 | 1 | 8 |
| 31 | 0 | 2 |
| 32 | 1 | -6 |
| 33 | 1 | 9 |

| Leaf | Value | Offset |
|---|---|---|
| 34 | 0 | 10 |
| 35 | 0 | 2 |
| 36 | 1 | -7 |
| 37 | 0 | 4 |
| 38 | 0 | 2 |
| 39 | 1 | 10 |
| 40 | 1 | -8 |
| 41 | 0 | 2 |
| 42 | 1 | -9 |
| 43 | 1 | 11 |
| 44 | 0 | 8 |
| 45 | 0 | 2 |
| 46 | 1 | -10 |
| 47 | 0 | 2 |
| 48 | 1 | -12 |
| 49 | 0 | 2 |
| 50 | 1 | -11 |
| 51 | 1 | -12 |
| 52 | 0 | 4 |
| 53 | 0 | 2 |
| 54 | 1 | 13 |
| 55 | 1 | 15 |
| 56 | 0 | 2 |
| 57 | 1 | 16 |
| 58 | 0 | 2 |
| 59 | 1 | 14 |
| 60 | 0 | 2 |
| 61 | 1 | -13 |
| 62 | 0 | 2 |
| 63 | 1 | -14 |
| 64 | 0 | 2 |
| 65 | 1 | -15 |
| 66 | 1 | -16 |

METHOD AND SYSTEM FOR LOSSLESS AND ADAPTIVE DATA COMPRESSION AND DECOMPRESSION

TECHNICAL FIELD

This invention relates to data compression and decompression, and more particularly, to a method and system for lossless and adaptive compression and decompression of data.

BACKGROUND OF THE INVENTION

The electronic collection of data at high speeds presents problems in many environments. For example, when clinical data is collected from a patient through a patient monitor vast amounts of data can be collected during a short interval. A computer system typically stores this data in computer memory for later processing. The computer memory is a limited resource that can quickly fill up with the collected data.

To reduce the memory requirements of collected data, some computer systems compress the data before storing it in the computer memory. When the collected data is needed for processing, the computer system decompresses the data. Thus, while the data is not needed, the memory requirements are minimized.

Many compression and decompression methods are known. Various methods have a variety of advantages. For example, some methods generate a large reduction in data size. Other methods preserve all the original data through the compression and decompression process. These methods are referred to as being lossless, because no data is lost. Other methods compress data very quickly or decompress data very quickly. These various methods also have a variety disadvantages. For example, some methods do not generate a large reduction in data size. Other methods do not preserve all the original data through the compression and decompression process, that is, the decompressed data is only an approximation of the original data. Also, some methods compress or decompress slowly. Some methods use considerable computer memory when compressing or decompressing.

It would be desirable to have a compression and decompression method in which data can be compressed and decompressed in real-time, in which a significant reduction in data size is achieved, in which the a small amount of computer memory is need for the compression and decompression method, and in which no data is lost.

SUMMARY OF THE INVENTION

It is an object of the present invention to provide a method and system for compressing and decompressing data in real-time.

It is another object of the present invention to provide a method and system in which compressed data uses significantly less memory than the raw data.

It is another object of the present invention to provide a data compression and decompression algorithm that does not require large amounts of memory during compression or decompression.

It is another object of the present invention to provide a method and system for compressing and decompressing data that is lossless.

These and other objects, which will become apparent as the invention is more fully described below, are obtained by an improved compression and decompression method and system. In preferred embodiments, the system compresses data by calculating the differences between adjacent data values, identifying a plurality of frequently occurring differences, tracking the frequency of occurrence of the identified differences, generating a first encoding for the identified differences, wherein the length of the encoding is based on the frequency of occurrence, generating a second encoding for the differences other than the identified differences, and for each calculated difference, encoding the calculated difference using the first encoding when the calculated difference is an identified difference and encoding the calculated difference using the second encoding when the calculated difference is not an identified difference to effect the compression of the data. In preferred embodiments, the first encoding is regenerated based on the tracked frequency of occurrences.

BRIEF DESCRIPTION OF THE DRAWINGS

FIG. 3 shows the data structures for arrays iValue, Value, and Count with sample data.

FIG. 4 shows the encodings generated for the data in array Count as shown in FIG. 3.

FIG. 5 shows the decoding tree generated for the data in array Count as shown in FIG. 3.

DETAILED DESCRIPTION OF THE INVENTION

Figure 1:
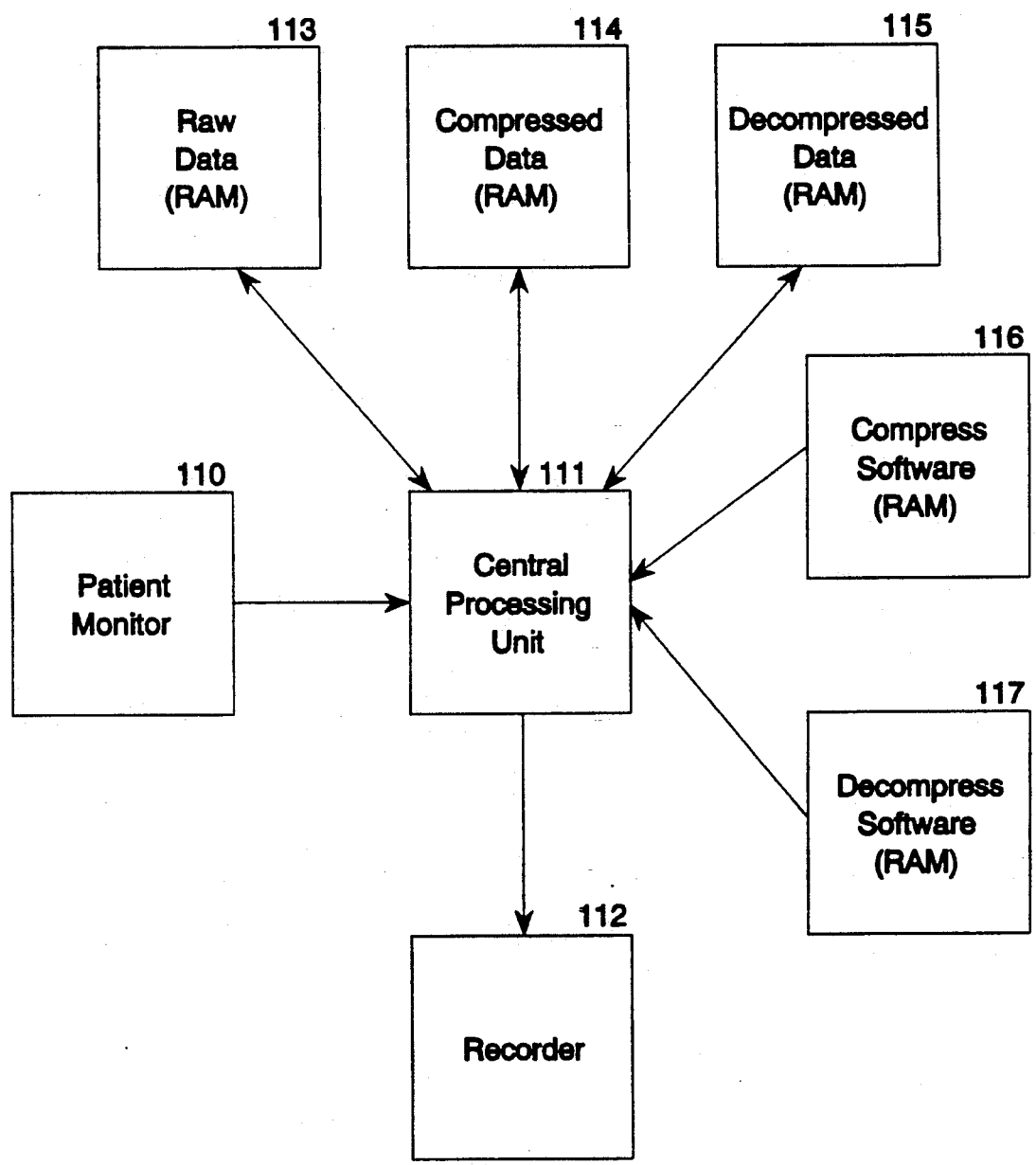
FIG. 1 is a schematic of a system implementing the compression and decompression techniques of the present invention.

FIG. 1 is a schematic of a system implementing the compression and decompression techniques of the present invention. The system collects patient data through Patient Monitor 110 and records the data on Recorder 112. Patient Monitor 110 collects various patient information and provides the Central Processing Unit 111 with 12 channels of information at a rate of approximately 448 bytes/second for each channel. The effective overall data rate is approximately 5.376Kbytes/second. When the Central Processing Unit 111 receives a byte of information form the Patient Monitor 110, it stores the data in the Raw Data RAM 113. After a "packet" of data is stored in the Raw Data RAM 113, the Central Processing Unit 111 invokes the compression routine stored in the Compress Software RAM 116. In one embodiment, a packet of data is predetermined number of bytes of data. One skilled in the art would appreciate that a packet of data may be defined in other ways, such as, data collected over a predefined time interval. The compression routine retrieves a packet of data from the Raw Data RAM 113, compresses the data, and stores the data in the Compressed Data RAM 114. Compressed Data RAM 114 may hold several packets of compressed data. When the Central Processing Unit 111 decides to record a packet of data, it invokes the decompression routine stored in Decompress Software RAM 117. The decompression routine retrieves the compressed packet from the Compressed Data RAM 114, decompresses the data in the compressed packet, and stores the data in the Decompressed Data RAM 115. The Central Processing Unit 111 retrieves the packet of decompressed data from the Decompressed Data RAM 115 and writes the data to the Recorder 112. The compression and decompression techniques of the present invention can be used in other system implementations. For example, the methods of the present invention can be use to compress data not related to a patient. Also, the data can be compressed as it is received and need not be stored in the Raw Data RAM 113. Also, the compressed data can be written to the Recorder 112 and need not be stored in Compressed Data RAM 114. The recorded data could then be decompressed at a later time.

In a preferred embodiment, the compression system converts the data (16-bit words) in a data packet to an initial value followed by a series of "deltas." Each delta is the difference between two adjacent words in the data packet. If a "run" of deltas is generated, the system converts the run to a run indicator, a run count, and a run delta value. A run is a series of adjacent deltas of the same value. For one type of patient data, it has been determined that most deltas are in the range of −16 to +16, called the encoded range. One skilled in the art would appreciate that a desirable encoded range varies with the type of data being compressed. The methods of the present invention can be used for various encoded ranges. The system encodes the encoded range and an escape symbol using a Shannon-Fano type encoding scheme, which is a modified Huffman encoding scheme. The system encodes 34 values, −16 through +16 and a value for an escape symbol. The system tracks the frequency that each of the 34 encoded values are encountered when compressing. After each packet is compressed (or just before a packet is to be decompressed), a new Shannon-Fano encoding is generated based on the updated frequency data. Thus, the encoding adapts to the compressed data. The "escape" symbol is a value outside the encoded range (e.g. 17) that is used to indicate either (1) that the subsequent data is not in the encoded range or (2) that a run is encoded. If data is not within the encoded range, it is indicated as either 8 bits or 16 bits. For example, if a delta is 64, the system would generate the following bit stream:

"01001000000"

In this example, the escape symbol is encoded as a "01." The "0" bit following the escape symbol indicates than an 8-bit value follows. The "01000000" bits are the 8-bit representation for 64. If a delta is 512, the system would generate the following bit stream:

"0110000000100000000"

In this example, the escape symbol is again encoded as a "01." The "10" bits following the escape symbol indicates that a 16-bit value follows. The "0000001000000000" bits are the 16-bit representation for 512. A run is encode as the escape symbol, run count, and run delta. For example, a run of 10 deltas equal to 5 would generate the following bit stream:

"01111111101001110110"

In this example the escape symbol is encoded as a "01." The "11" bits following the escape symbol indicates that a run encoding follows. The "111110100" bits indicates a run count of 10. The "1110110" bits indicate a run delta value of 5. Also, if the run count or run delta is not within the encoded range, the system encodes the run count or run delta with an escape symbol. For example, a run of 32 deltas equal to 5 would generate the following bit stream:

"0111010001000001110110"

In this example, the escape symbol is encodes as a "01." The "11" bits following the escape symbol indicates that a run encoding follows. The following "01" bits represent the escape symbol, which indicates that the run count is not within the encoded range. The "0" bit after the escape symbol indicates that the run count is encoded in the following 8 bits. The "00100000" bits indicates a run count of 32. The bits indicate a run delta value of 5. If the run delta value was not within the encode range, then it would also be encoded with an escape symbol.

The system determines when to encode a run based on the run delta value and minimum possible run length. If the run delta value is not within the encoded range, then the run is encoded. If the minimum possible run encoding length is less than the run count times the number of bits needed to encode the run delta value, then the run is encoded. The minimum run encoding length is the length of the escape symbol plus 2 (bits to indicate a run) plus 2 times the length of the shortest encoding. One skilled in the art would appreciate that the determination of whether to encode a run could be based on other factors. In one embodiment, the run count is encoded as the actual run count minus 2 since a run is defined as two or more deltas. Also, a run length up to 35 can be encoded by representing certain run lengths a negative values.

The compression routine generates the encoding for the 34 symbols using the Shannon-Fano encoding method, which is a recursive algorithm. In a preferred embodiment, the method is implemented as an iterative algorithm as described in detail below. The routine starts with a sorted array of frequency counts for all the symbols to be encoded. The method calculates the total of the frequencies. The method then starts with the most frequent symbol and sums the frequencies in the array until the sum reaches half the total. The method then divides the symbols into two sets. The first set contains the symbols encountered in the summing, and the second set contains the other symbols. The symbols in the first set are assigned a bit value of "0," and the symbols in the second set are assigned a bit value of "1." The method recursively applies the algorithm to generating the encoding. Table 1 shows a recursive routine written in a pidgin C programming language that implements a Shannon-Fano encoding. When the routine completes, array BitPattern contains the encoding pattern for each of the encoded values and array Size contains the length of the corresponding bit patterns. The routine inputs a sorted array of frequency counts for each of the encoded values in array Count. When first invoked, the variables Start and End delimit the start and end of array Count, the variable Total contains the total of the frequencies, and variables BitSize and Bits are set to 0. The routine recursively divides the array based on the sum of the entries and sets variable Bits to indicate the encoding. Each time the array Count is subdivided to contain 1 entry (Start===End), then the routine sets array entry Size[Start] equal to variable BitSize and array entry BitPattern[Start] to variable Bits.

TABLE 1

```
S_F (Start, End, Total, BitSize, Bits)
{
    if Start != End
    {
        BitSize++;
        i = Start;
        A = 0;
        while (i < End) && (2 * A + Count[i] < Total)
            {A = A + Count[i++];}
        if i == Start
        {
            A = Count [i++];
            call S_F (Start, i-1, A, BitSize,
                    Bits & ~(1<<(16-BitSize)));
            call S_F (i,End, Total-A, BitSize,
                    Bits | (1<<(16-BitSize)));
        }
    }
    else
    {
        Size[Start] = BitSize;
        BitPattern[Start] = Bits;
    }
}
```

A main feature of a Huffman-style encoding is that even though there is a variable number of bits per symbol there is no need for a delimiter between symbols. The encoding guarantees that the pattern of bits used in the shorter encodings will never occur as the beginning of the pattern for a longer encoding.

The decompression system builds a binary tree using the same frequency count values that were used to establish the encoding. In a preferred embodiment, the Shannon-Fano method is also used to build the binary tree, such that, when decompressing, rather than creating bits, the method creates nodes on a tree. The creation of the binary tree is described below in detail. To decode, the system inputs the bit stream of compressed data. On a "0" bit the routine follows the "0" branch of the binary tree, and on a "1" bit the routine follows the "1" branch of the binary tree. If a leaf node is reached, then that node contains the corresponding decoded value, else the routine inputs the next bit and continues through the tree. When 34 symbols are encoded, the tree contains 34 leaf nodes and 33 non-leaf nodes. In a preferred embodiment, one byte is used to represent each node. Thus, the decoding tree is 67 bytes in length. The tree is represented in an array of length 67. Each node (or byte in the array) contains an indicator of whether it is a leaf node. If the node is a leaf node, it contains the corresponding decoded value. If the node is not a leaf noded, it contains the relative offset within the tree to the node at the "1" branch. The node at the "0" branch is stored in the next byte in the tree.

Although the encoding method is adaptive, it needs to start with default frequencies for encoding the first packet. In a preferred embodiment, the default frequencies are obtained by generating the frequencies for several packets of data.

In a preferred embodiment, the frequency counts are only partially sorted, rather than completely sorted. The frequency counts are partially sorted by making one pass through the array of frequency counts and exchanging adjacent entries when the second entry is larger than the first entry. This partial sorting slows down the adaption. The default frequency values are generally more representative of the frequencies than the data in the first packet. Consequently, the partially sorting, during the first few packets, tends to reflect the more representative frequency characteristics of the default frequencies.

Figure 2:
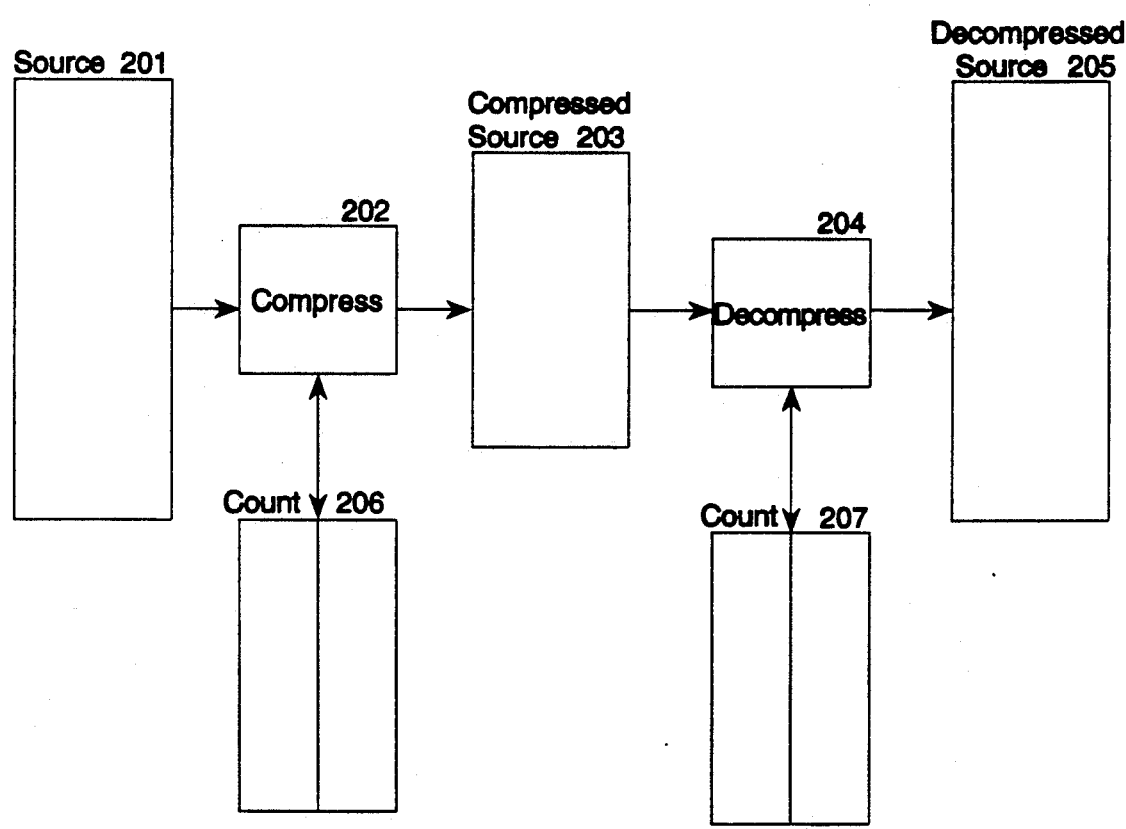
FIG. 2 is a diagram showing the data flow through the compression and decompression routines.

FIG. 2 is a diagram showing the data flow through the compression and decompression routines. The routine Compress 202 compresses the data in the Source 201 and generates the Compressed Source 203. The routine Decompress 204 decompresses the Compressed Source 203 and generates the Decompressed Source 205. Because the compression methods of the present invention are lossless, the Decompressed Source 205 contains the same data as the Source 201. Arrays Count 206 and 207 contain the frequency counts for the routine Compress 202 and the routine Decompress 204, respectively. After each compression, the routine Compress 202 updates the frequencies in array Count 206. Similarly, after each decompression, the routine Decompress 204 updates the frequencies in array Count 207. Initially, arrays Count 206 and 207 contain the same default frequency values. After a packet has been compressed and then decompressed, arrays Count 206 and 207 contain the same data.

FIGS. 3, 4, and 5 show data structures used in the compression and decompression routines with samples data values. FIG. 3 shows the data structures for arrays iValue 301, Value 302, and Count 303 with sample data. Array Count 303 contains the frequency count for each symbol in the encoded range and the escape symbol (encoded symbols). Array Value 302 contains the value for each encoded symbol. There is a one-to-one correspondence between array Count 303 and array Value 302. For example, the fifth entry in array Value is the symbol 3. The fifth entry in array Count is 10197, which indicates that symbol 3 has a frequency count of 10197. Array iValue 301 contains a mapping from an encoded symbol to the corresponding entry in arrays Value and Count. For example, the array entry iValue[16+3] contains a 4, which is the index into array Count that contains the frequency count for symbol 3. Thus, the frequency for symbol 3 is in array entry Count[iValue[16+3]]. The symbol is increased by 16 when indexing array iValue to place the index within the range of 0 to 33. FIG. 4 shows the encodings generated for the data in array Count 303. Array BitPattern 401 contains an encoding for each encoded symbol. Array Size 402 contains the length of the corresponding encoding in array BitPattern. For example, the fifth entry in array BitPattern, "1100" has a length of 4 as indicated by array entry Size[4]. In a preferred embodiment, array BitPattern contains 16-bit entries, which limit the maximum encoding length to 16. Array entry BitPattern[iValue[16+3]] contains the bit pattern for symbol 3. FIG. 5 shows the decoding tree generated for the data in array Count 303. The array Tree 501 contains 67 one-byte entries, one entry for each node in the decoding tree. Each node contains a flag indicating whether the node is a leaf. If the node is a leaf, then it contains the symbol value for that leaf. If the node is not a leaf, then it contains the relative offset to the "1" branch node. The "0" branch node is the immediately following entry in array Tree. To decode bit stream "1100" to symbol 3, the system proceeds as follows. The system starts at array entry Tree indexed by 0, which is the root of the tree. When the first "1" bit is encountered, the system follows the "1" branch by adding Tree[0].Offset to the current position in array Tree. This resets the current position to array entry Tree[4]. Since array entry Tree[4] is not a leaf, then the system inputs the next bit, which is a "1.". The system follows the "1" branch by adding Tree[4].Offset to the current position in array Tree. This resets the current position to array entry Tree[8]. Since array entry Tree[8] is not a leaf, then the system inputs the next bit, which is a "0." The system follows the "0" branch by adding 1 to the current position in array Tree. This resets the current position to array entry Tree[9]. Since array entry Tree[9] is not a leaf, then the system inputs the next bit, which is a "0." The system follows the "0" branch by adding 1 to the current position in array Tree. This resets the current position to array entry Tree[10]. Since array entry Tree[10] is a leaf, then the system retrieves Tree[10].Value, which is a 3. Thus, the bits "1100" are an encoding of symbol 3.

Figure 6:
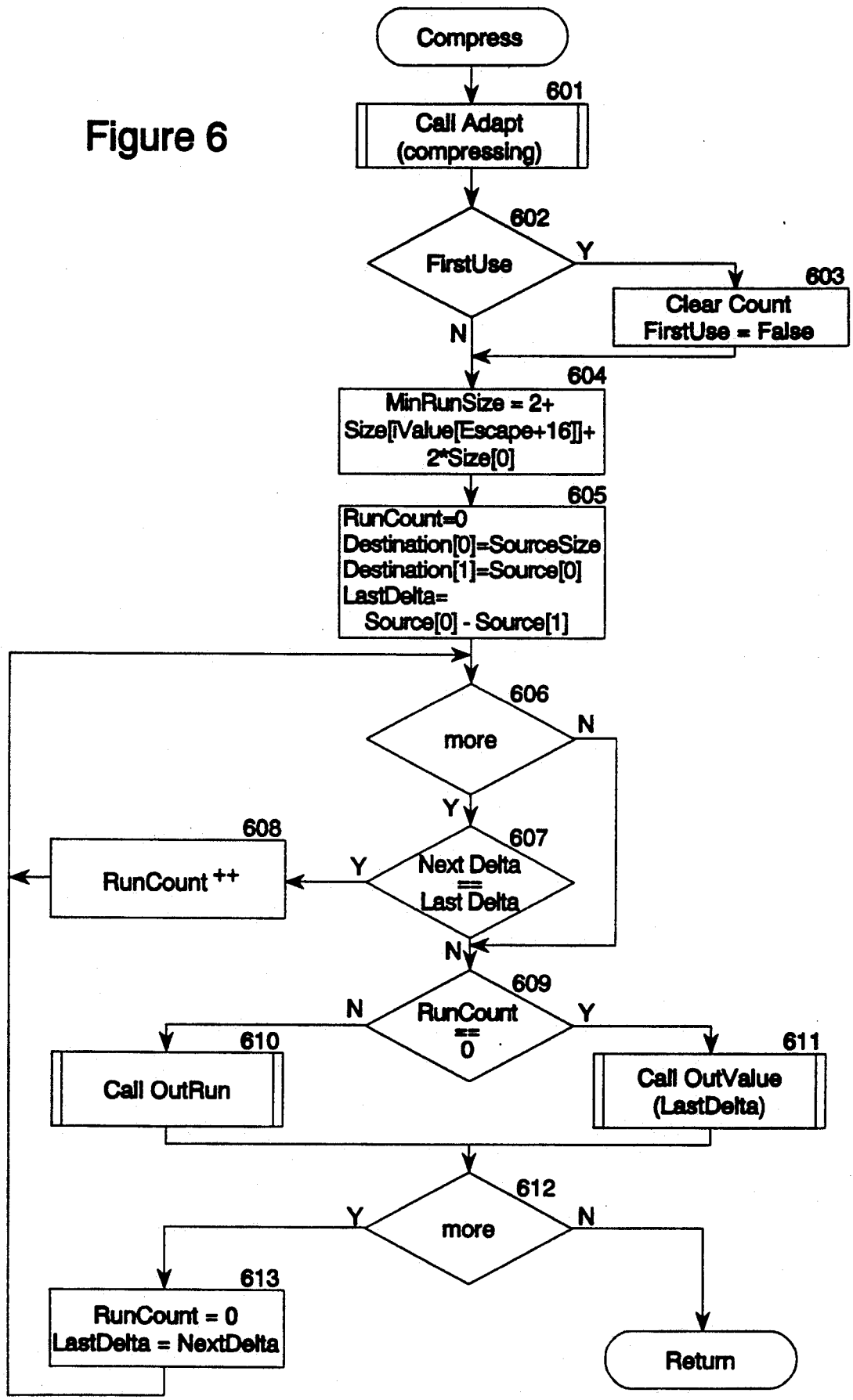
FIG. 6 is a flow diagram of the Compress routine.

FIG. 6 is a flow diagram of the Compress routine. Routine Compress inputs source data and outputs the compressed source data. The inputs to routine Compress are array Source, array Count, and array Value. The routine returns array Destination, array Count, and array Value. Routine Compress first generates the encoding by invoking routine Adapt, which stores the encoding in arrays BitPattern and Size. Routine Compress then sets array Count to zeroes the first time it is invoked. The clears the default frequency counts and initializes the array for the actual frequency counts. The Routine Compress then calculates the delta values and stores the compressed data using the encoding in array BitPattern, run encoding, and encoding for delta values outside the encoded range. In block 601, the routine calls routine Adapt to generate the adaptive encoding for the compression, which is returned in arrays Size and BitPattern. In block 602, if flag FirstUse is True, then this is the first time through routine Compress and the routine continues at block 603, else the routine continues at block 604. In block 603, the routine initializes the entries in array Count and sets flag FirstUse to False. The first time that routine Adapt is invoked it uses array Count with default frequency counts; routine Compress then sets array Count to the actual frequency counts to effect the adaptation. In block 604, the routine sets variable MinRunSize equal to 2 plus the size of the escape bit pattern plus 2 times the size of the smallest bit pattern, which is the minimum bit length of an encoded run. In blocks 605 through 613, the routine loops processing each entry in array Source. The routine calculates the delta values and outputs the encodings to array Destination. In block 605, the routine initializes variables for the looping through array Source and outputs initial data to array Destination. The routine sets variable RunCount to 0, sets array entry Destination[0] to the size of array Source, sets array entry Destination[1] to array entry Source[0], and sets variable LastDelta to array entry Source[0] minus array entry Source[1]. Variable LastDelta contains the difference between the current and previous array Source entries. In block 606, if all the data in array Source has been processed, then the routine continues at block 609 to output the last encoded data to array Destination, else the routine continues at block 607. In block 607, the routine sets variable NextDelta to the difference between the current and next array Source entries. If variable NextDelta equals variable LastDelta, then a run is in progress and the routine continues at block 608, else the routine continues at block 609. In block 608, the routine increments variable RunCount and loops to block 606. In block 609, if variable RunCount equals 0, then there is no run and the routine continues at block 611, else the routine continues at block 610. In block 610, the routine invokes routine OutRun to output the run data to array Destination. In block 611, the routine invokes routine OutValue to output the value in variable LastDelta to array Destination. In block 612, if all the data in array Source has been processed, then the compression is complete and the routine returns, else the routine continues in block 613. In block 613, the routine resets variable RunCount to 0, sets variable LastDelta to variable NextDelta, advances to the next entry in array Source, and loops to block 606 to process the next delta value.

Figure 7:
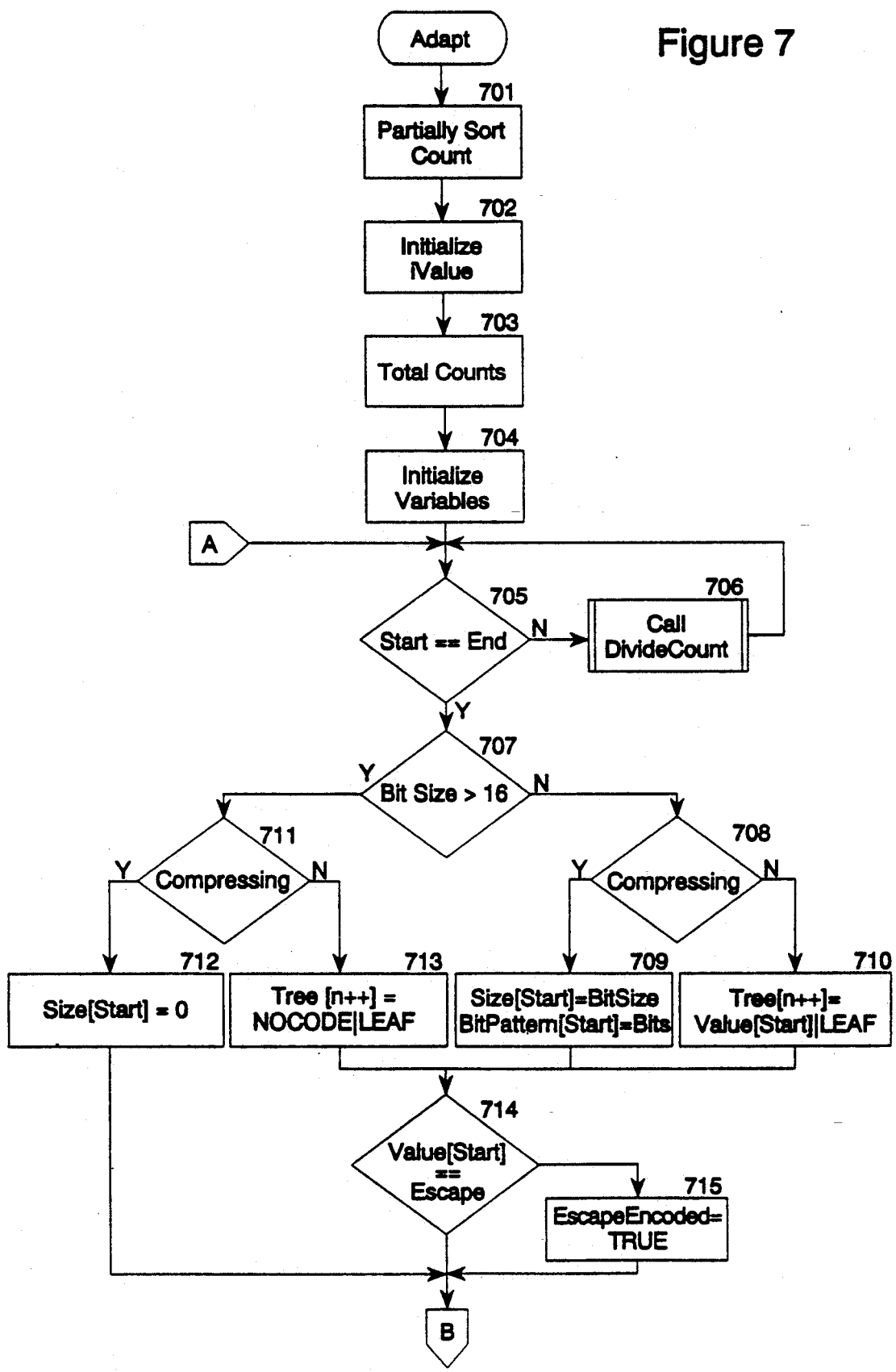
FIG. 7 is a flow diagram of the Adapt routine.
Figure 7:
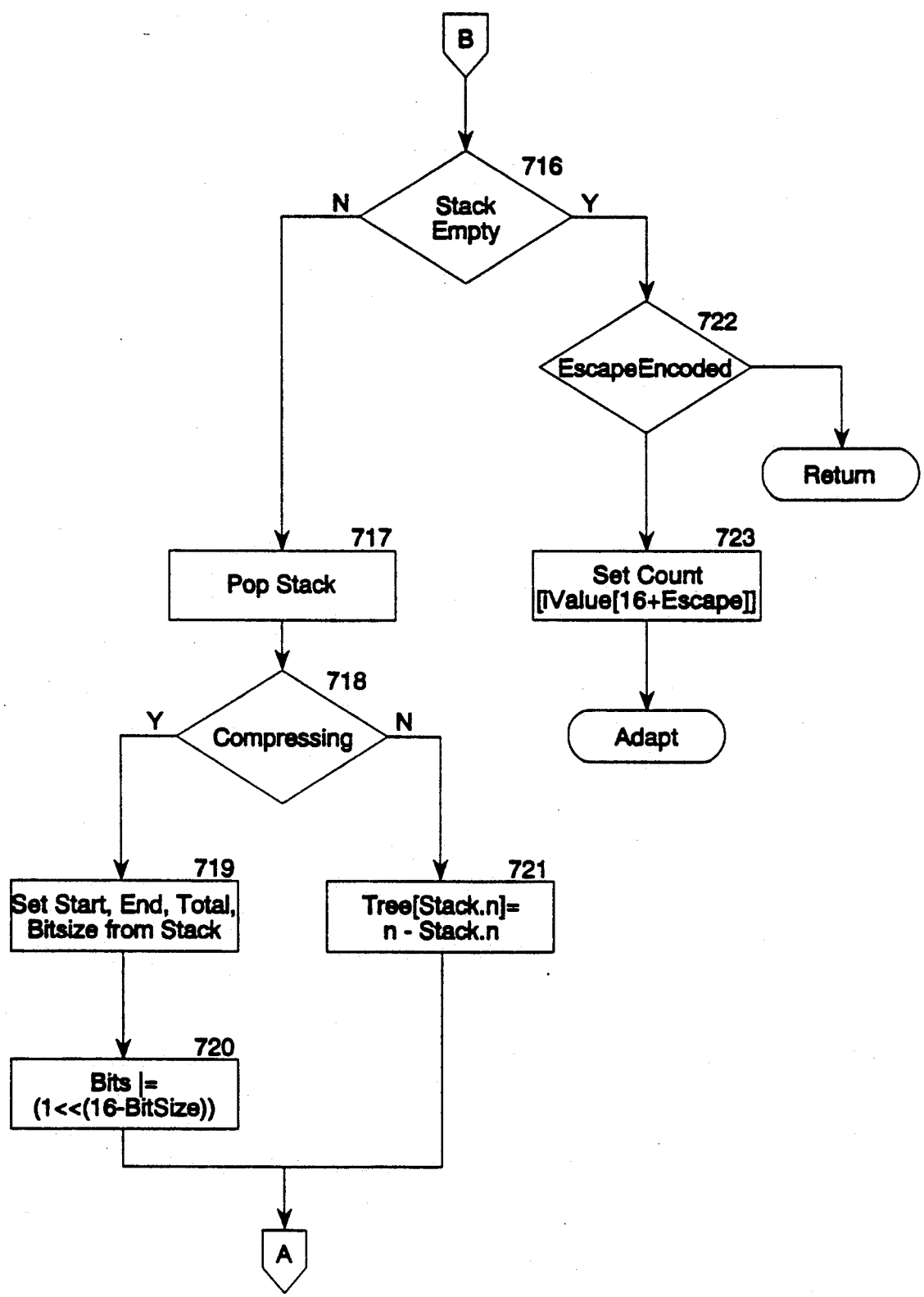

FIG. 7 is a flow diagram of the Adapt routine. In a preferred embodiment, the generation of the encoding and decoding data is accomplished in the same routine. When compressing, routine Adapt generates encoding for the data based on array Count and stores the encoding information in arrays BitPattern and Size. When decompressing, routine Adapt generates decoding for the data based on arrays Count and Value and stores the decoding information in array Tree. The input parameters for routine Adapt are the arrays Count and Value and a flag indicating whether compressing or decompressing. When compressing, the routine returns arrays BitPattern and Size. When decompressing, the routine returns array Tree. Routine Adapt is an iterative implementation of the recursive routine described above when compressing. The routine uses a stack to implement the recursive nature of the routine. In an alternate embodiment, routine Adapt is implemented as in-line code in routine Compress. In the following, when the stack is popped, the popped data is stored in the structure Stack. Similarly, when the stack is pushed, the data from the structure Stack is pushed onto the stack. The data structure Stack contains elements Start, End, Total, BitSize, and N, which are described below in detail. Information relating to the "1" branches is pushed on the stack. The information is popped from the stack after the corresponding "0" branch is processed. In block 701, the routine partially sorts array Count. The routine makes one pass through array Count exchanging adjacent entries when the second entry is larger than the first entry. Alternatively, the routine completely sorts array Count. The routine also exchanges the entries in array Value to maintain the correspondence between the arrays. In block 702, the routine initializes array iValue. Array iValue contains a mapping from the encoded symbols to the indices into arrays Count and Value for the corresponding entries. Thus, array entry Count[iValue[16+Escape]] contains the frequency count for the escape symbol. In block 703, the routine sets variable Total to the sum of all entries in array Count. In a preferred embodiment, to prevent an overflow, the routine divides all counts in array Counts by two and recalculates the total, when the variable Total is larger than 26000. In block 704, the routine initializes the variables Start, n, Bits, and BitSize to 0, the variable End to 33, and the flag EscapeEncoded to False. The variables Start and End are indices into array Count; variable BitSize contains the size of the encoding bit pattern; variable Bits contains the encoding bit pattern; variable n is an index into array Tree; and flag EscapeEncoded indicates when the escape character has been encoded. In blocks 705 through 721, the routine loops generating an encoding or decoding depending on the input parameters. In blocks 705 and 706, the routine loops invoking routine DivideCount. Routine DivideCount is described below in detail. Routine DivideCount returns with variables Start and End to delimit a "0" branch and data relating to the "1" branch pushed onto the stack. In block 705, if variable Start equals variable End, then a leaf on the encoding has been identified and continues at block 707, else the routine continues at block 706. In block 706, the routine invokes routine DivideCount and loops to block 705. In block 707, if variable BitSize is greater than 16, then the routine continues at block 711, else the routine continues at block 708. Because array BitPattern has 16 bit entries, an encoding greater than 16 bits is suppressed and treated as an escape encoding. In block 708, if compressing, then the routine continues at block 709, else the routine continues at block 710. In block 709, the routine sets the encoding bit pattern to the symbol in array entry Value[Start]. The routine sets array entry Size[Start] equal to variable BitSize and sets array entry BitPattern[Start] to variable Bits. In block 710, the routine sets array entry Tree[n] to array entry Value[Start] and to indicate a leaf node, and increments variable n to index the next entry in array Tree. In block 711, if compressing, then the routine continues at block 712, else the routine continues at block 713. In block 712, the routine sets array entry Size[Start] to 0 to indicate that the delta value Corresponding to the entry is not encoded. In block 713, the routine sets array entry Tree[n] to indicate no encoding and a leaf node, and increments variable n to index the next entry in array Tree. In block 714, if array entry Value[Start] equals the escape symbol, then the routine sets variable EscapeEncoded equal to True. Variable EscapeEncoded tracks whether the escape symbol has been encoded. The escape symbol must be encoded. The routine sets the frequency count for the escape symbol to ensure its encoding will not be greater than 16 bits and thus encoded. In block 716, if the stack is empty, then the routine continues at block 722, else the routine continues at block 717, In block 717, the routine pops the stack. In block 718, if compressing, then the routine continues at block 719, else the routine continues at block 721. In block 719, the routine sets variables Start, End, Total, and BitSize based on the popped stack values. In block 720, the routine bitwise-ORs the variable Bits with 1 shifted left 16 minus variable BitSize times, which sets a bit in variable Bits to indicate a "1" encoding, and loops to block 705. In block 722, if variable EscapeEncoded equals True, then the routine returns, else the routine continues at block 723. The escape character must be encoded. In block 723, the routine sets array entry Count iValue[16+Escape]] to a high frequency so that the escape symbol will be encoded and the routine loops to restart routine Adapt.

Figure 8:
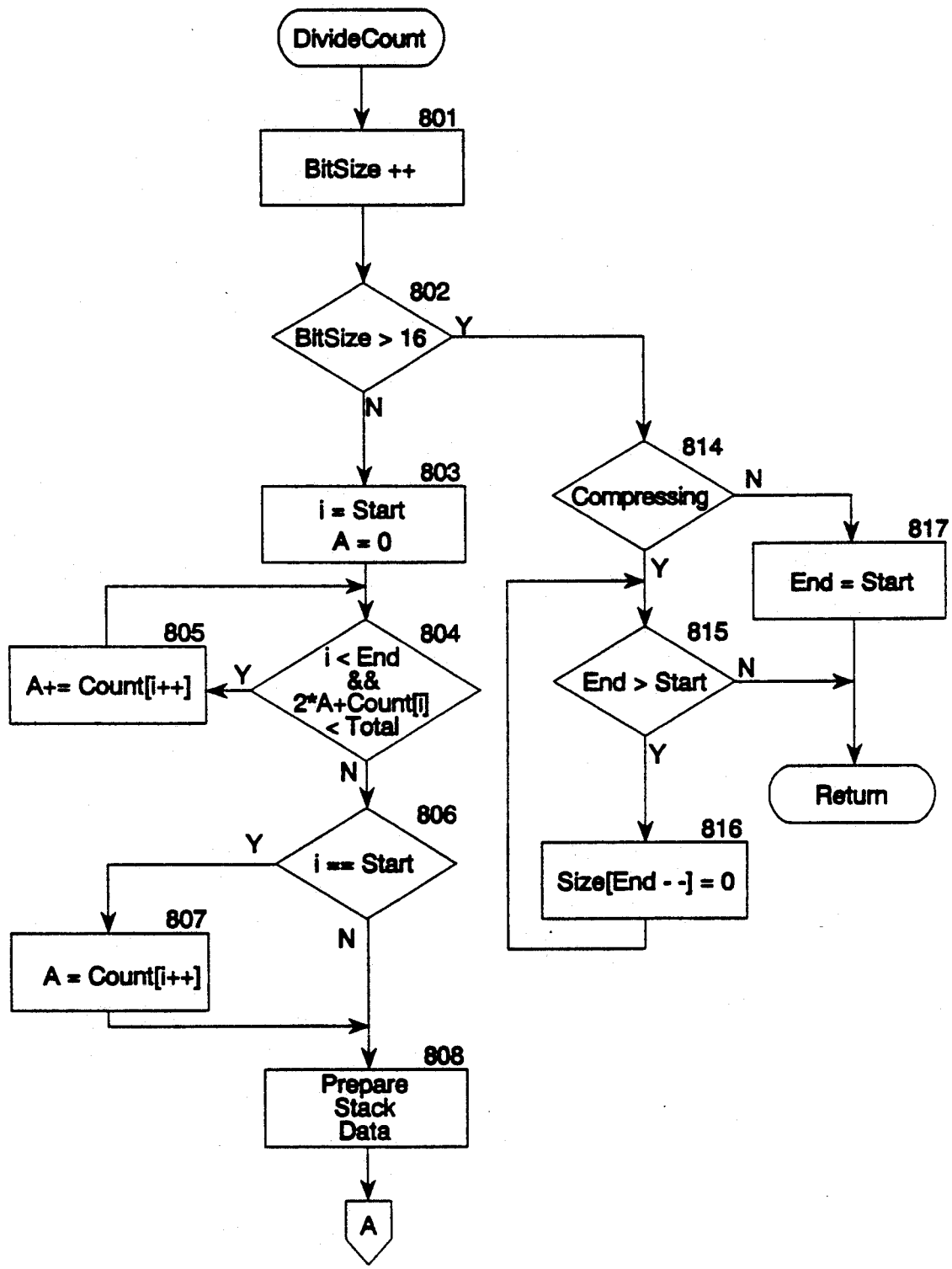
FIG. 8 is a flow diagram of the DivideCount routine.
Figure 8:
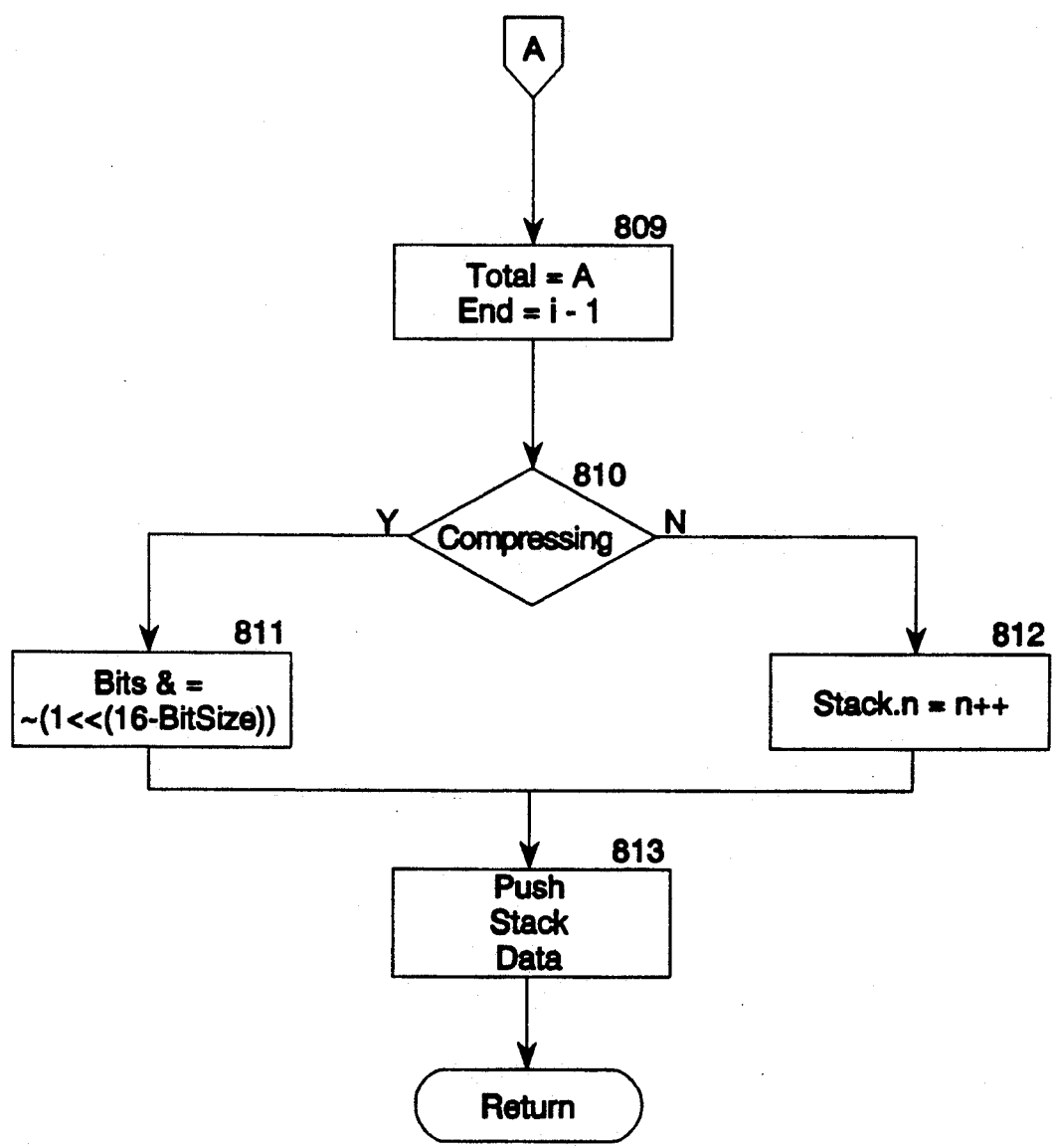

FIG. 8 is a flow diagram of the DivideCount routine. Routine DivideCount divides array Count from the entry indexed by variable Start to the entry indexed by variable End based on the sum of the entries. Routine DivideCount resets variable End to delimit the "0" branch and pushes data onto the stack to delimit the "1" branch. In block 801, the routine increments variable BitSize, which contains the size of the encoding bit pattern. In block 802, if variable BitSize is greater than 16, then the routine continues at block 814, else the routine continues at block 803. As described above, if the encoding bit size is greater than 16, then the corresponding symbol is not encoded. In blocks 803 through 807, the routine sums the entries in array Count from the entry indexed by variable Start until the sum is approximately half of the variable Total, which contains the sum of the entries in array Count from the entry index by variable Start to the entry indexed by variable End. In block 803, the routine initializes index i to variable Start and variable A to 0. Index i steps through the array Count and variable A contains the sum of the entries in array Count from the entry indexed by variable Start the entry indexed by index i. In block 804, if index i is less than variable End and two times variable A plus array entry Count[i] is less than variable Total, then the routine is not at the half count point of the entries and the routine continues at block 805, else the routine continues at block 806. In block 805, the routine adds array entry Count[i] to the variable A, increments index i, and loops to block 804. In blocks 806 and 807, the routine ensures that variable A is set and index i is incremented. In block 806, if index i equals variable Start, then the routine continues at block 807, else the routine continues at block 808. In block 807, the routine sets variable A equal to Count[i] and increments index i. In block 808, the routine set the variable in structure Stack. The routine sets Stack.Start equal to index i, Stack.End equal to variable End, Stack.Total equal to variable Total minus variable A, and Stack.BitSize equal to variable Bitsize. Structure Stack contains the data process the "1" branch. In block 809, the routine set variable Total to variable A and variable End to index i minus 1. The variables Start, End, Total, and BitSize contain the information to process the "0" branch. In block 810, if compressing, then the routine continues at block 811, else the routine continues at block 812. In block 811, the routine bitwise-ANDs variable Bits with and the complement of 1 shifted left 16 minus variable BitSize times, which sets the bit in Bits to a 0 to indicate the "0" encoding. In block 812, the routine sets Stack.n to variable n and increments variable n and increments the variable n. The incrementing of variable n adds a node to array Tree. The setting of Stack.n tracks the "1" branch so that the offset can be added to the current node when the node for the "1" branch is added. In block 813, the routine pushes the data onto the stack and returns. In block 814, if compressing, the routine continues at block 815, else the routine continues at block 817. In blocks 815 and 816, since the bit pattern would be larger than 16, the routine zeros out the array Size entries with indices between variables Start and End. A zero array Count value indicates that there is no encoding for the corresponding symbol. In block 815, if variable End is greater than the variable Start, then the routine continues at block 816, else the zeroing out is complete and the routine returns. In block 816, the routine sets array entry Size[End] equal to 0, decrements variable End, and loops to block 815. In block 817, since the bit pattern would be larger than 16, the routine sets variable End equal to variable Start and returns.

Figure 9:
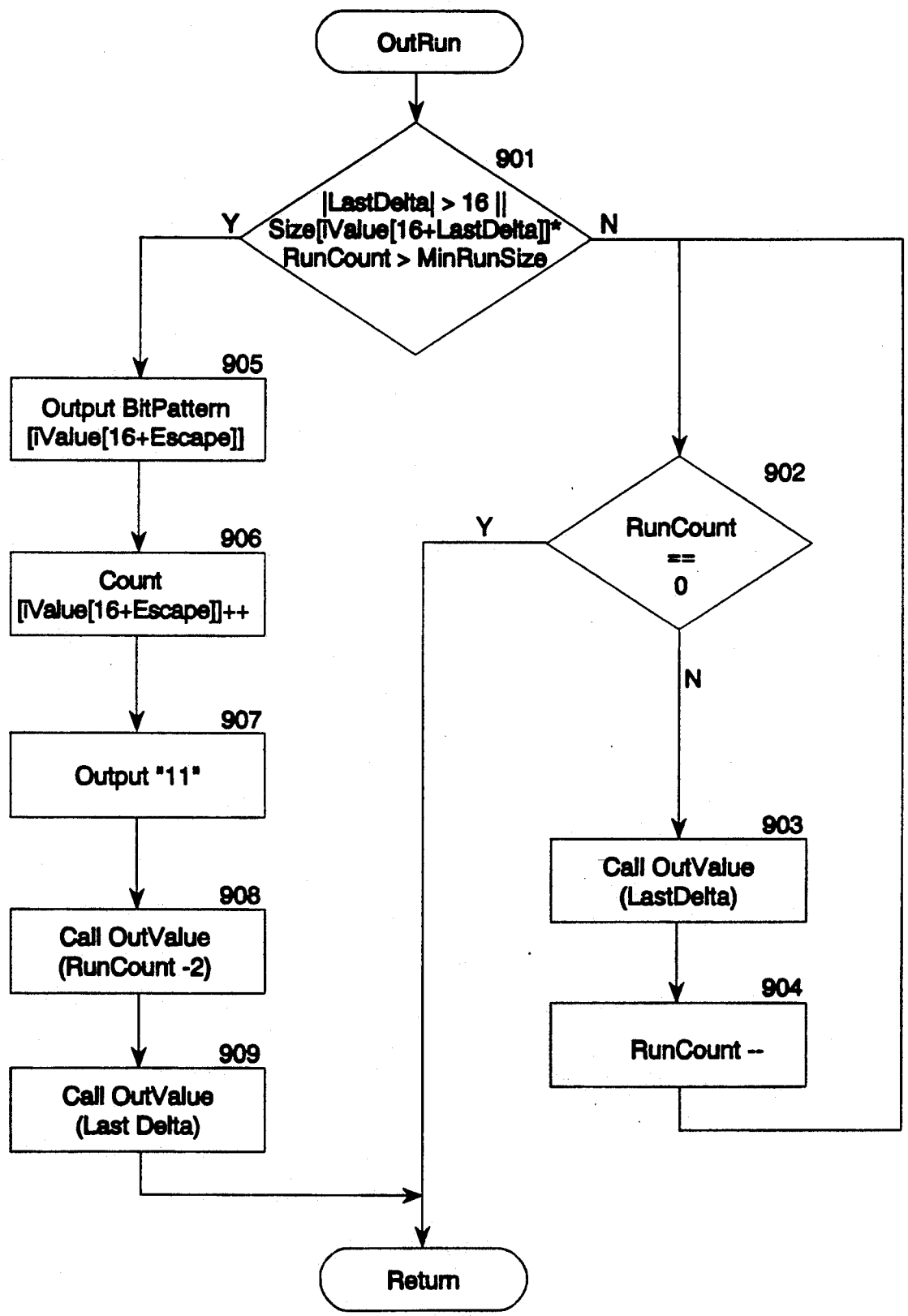
FIG. 9 is a flow diagram of the routine OutRun.

FIG. 9 is a flow diagram of the routine OutRun. Routine OutRun receives a run delta value and run count and outputs encoded run information to array Destination. In block 901, if the absolute value of variable LastDelta is greater than 16 or array entry Size[iValue[16+LastDelta]] times variable RunCount is greater than variable MinRunSize, then the run is to be encoded as a run and the routine continues at block 905, else the routine continues at block 902. In block 902 through 904, the routine outputs the variable LastDelta to the array Destination the number of times indicated in variable RunCount. In block 902, if variable RunCount equals 0, then the output is complete and the routine returns, else the routine continues at block 903. In block 903, the routine calls routine OutValue to output the value in variable LastDelta. In block 904, the routine decrements variable RunCount and loops to block 902. In block 905, the routine outputs to array Destination the array entry BitPattern[iValue[16+Escape]], which contains the encoding for the escape symbol. In block 906, the routine increments array entry Count[iValue[16+Escape]] to track the frequency of the use of the escape symbol. In block 907, the routine outputs "11" to indicate an encoded run. In block 908, the routine calls routine OutValue to output variable RunCount minus 2, which indicates the length of the run. In block 909, the routine calls routine OutValue to output variable LastDelta, which indicates the run delta value, and the routine returns.

Figure 10:
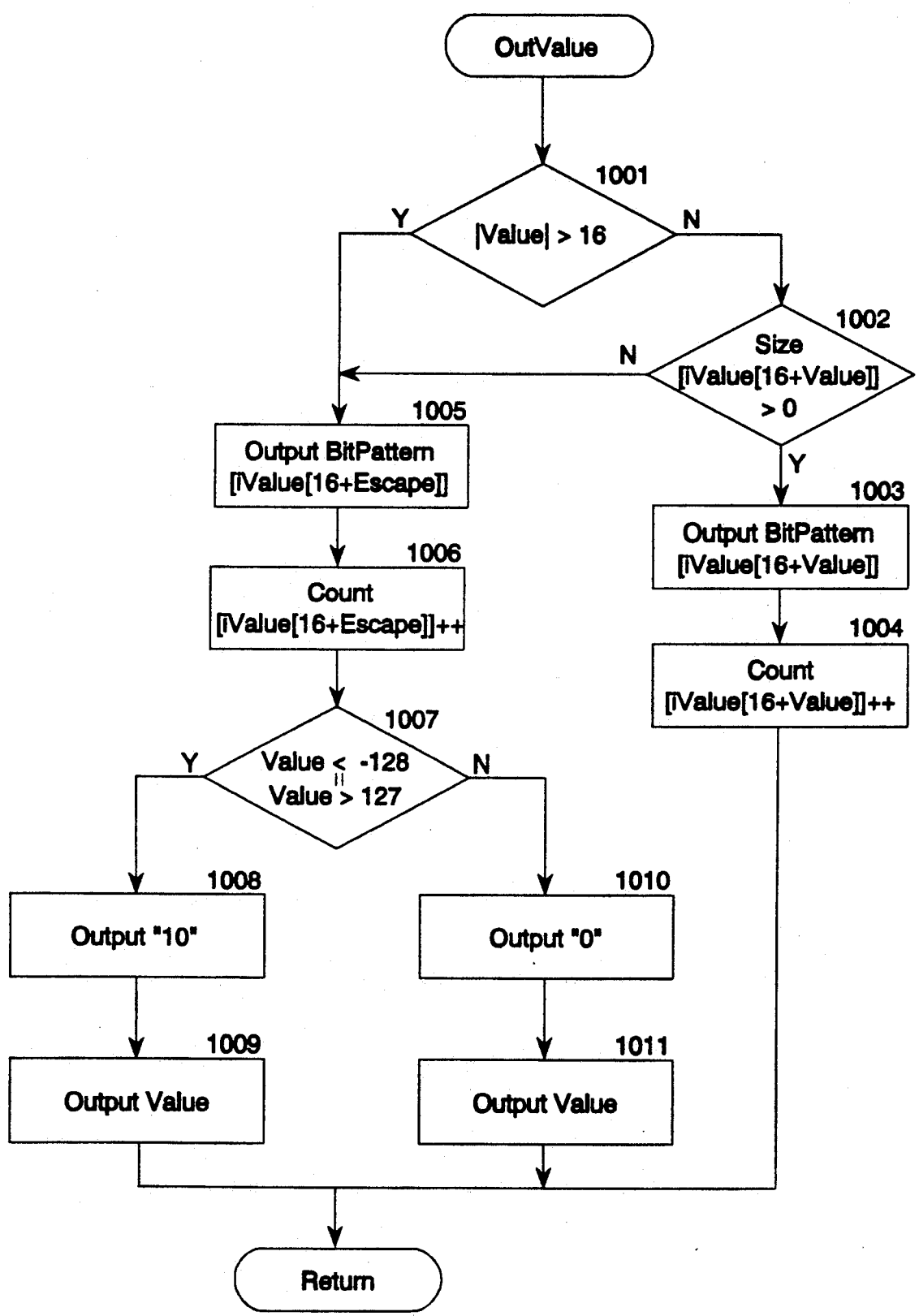
FIG. 10 is a flow diagram of the routine OutValue.

FIG. 10 is a flow diagram of the routine OutValue. Routine OutValue receives a value and outputs the encoded value to array Destination. In block 1001, if the absolute value of the variable Value is greater than 16, then it the value cannot be encoded and the routine continues at block 1005, else the routine continues at block 1002. In block 1002, if array entry Size[iValue[16+Value]] is greater than 0, then the value can be encoded and the routine continues at block 1003, else the routine continues at block 1005. In block 1003, the routine outputs to array Destination the array entry BitPattern[iValue[16+Value]], which contains the encoding for the value in variable Value. In block 1004, the routine increments array entry Count[iValue[16+Value]] to track the frequency of the delta values, and the routine returns. In blocks 1005 through 1011, the routine outputs values outside the range of −16 to +16. In block 1005, the routine outputs to array Destination the array entry BitPattern[iValue[16+Escape]], which contains the encoding for the escape symbol. In block 1006, the routine increments array entry Count[iValue[16+Escape]] to track the frequency of the use of the escape symbol. In block 1007, if variable Value is greater than 127 or less than −128, then Value cannot fit into 8 bits and the routine continues at block 1008, else the routine continues at block 1010. In block 1008, the routine outputs "10" to indicate that the following 16 bits contain the value. In block 1009, the routine output the variable Value in 16 bits and the routine returns. In block 1010, the routine outputs "0" to indicate that the following 8 bits contain the value. In block 1011, the routine outputs the variable Value in 8 bits and the routine returns.

Figure 11:
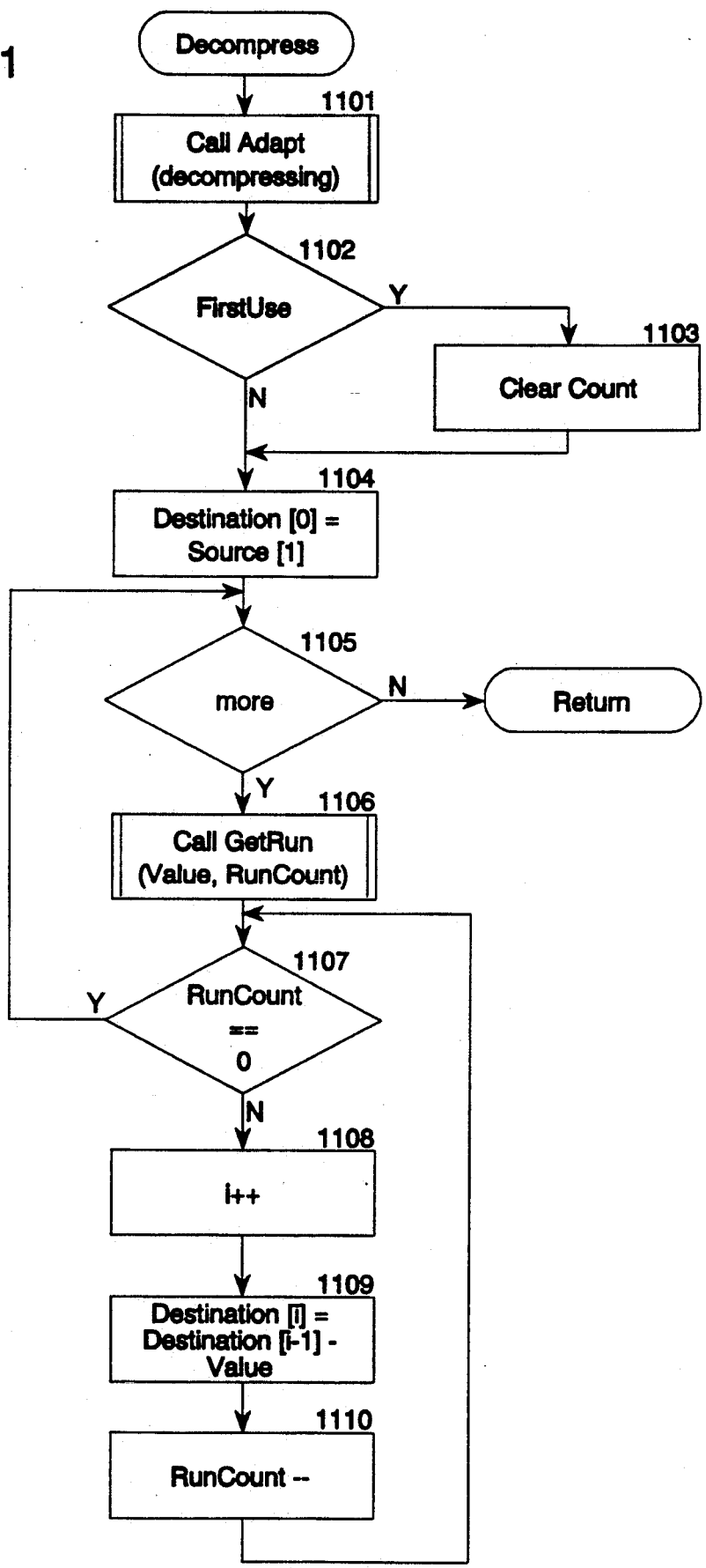
FIG. 11 is a flow diagram of the Decompress routine.

FIG. 11 is a flow diagram of the Decompress routine. Routine Decompress inputs compressed source data and outputs the decompressed source data. The inputs to the routine Decompress are array Source, array Count, and array Value. The routine returns array Destination, array Count, and array Value. Routine Decompress first generates a decoding tree by invoking routine Adapt, which stores the decoding tree in array Tree. Routine Decompress then sets array Count to zeroes the first time it is invoked. This clears the default frequency counts and initializes the array for the actual frequency counts. Routine Decompress retrieves the next data by invoking routine GetRun, which returns a delta value and a run count. Routine Decompress then creates the array Destination entries using the delta values. In block 1101, the routine calls routine Adapt to generate the decoding Tree, which is returned in array Tree. In block 1102, if FirstUse is True, then the routine continues at block 1103, else the routine continues at block 1104. In block 1103, the routine sets each of the entries in array Count to zero, as described above in routine Compress. In block 1104, the routine sets array entry Destination[0] to array entry Source[1], which sets the first value. The routine also sets index i to 0. Index i indexes array Destination. In block 1105, if all the data in array Source has been processed, then the routine returns, else the routine continues at block 1106. In block 1106, the routine call routine GetRun, which retrieves the next delta value and a run count. In blocks 1107 through 1110, the routine loops decompressing the data in the run. In block 1107, if variable RunCount equals 0, then the run has been decompressed and the routine loops to block 1105, else the routine continues at block 1108. In block 1108, the routine increments index i. In block 1109, the routine sets array entry Destination[i] to array entry Destination[i−1] minus the delta value to decompress the data. In block 1110, the routine decrements variable RunCount and loops to block 1107 to determine if all the compressed data has been decompressed.

Figure 12:
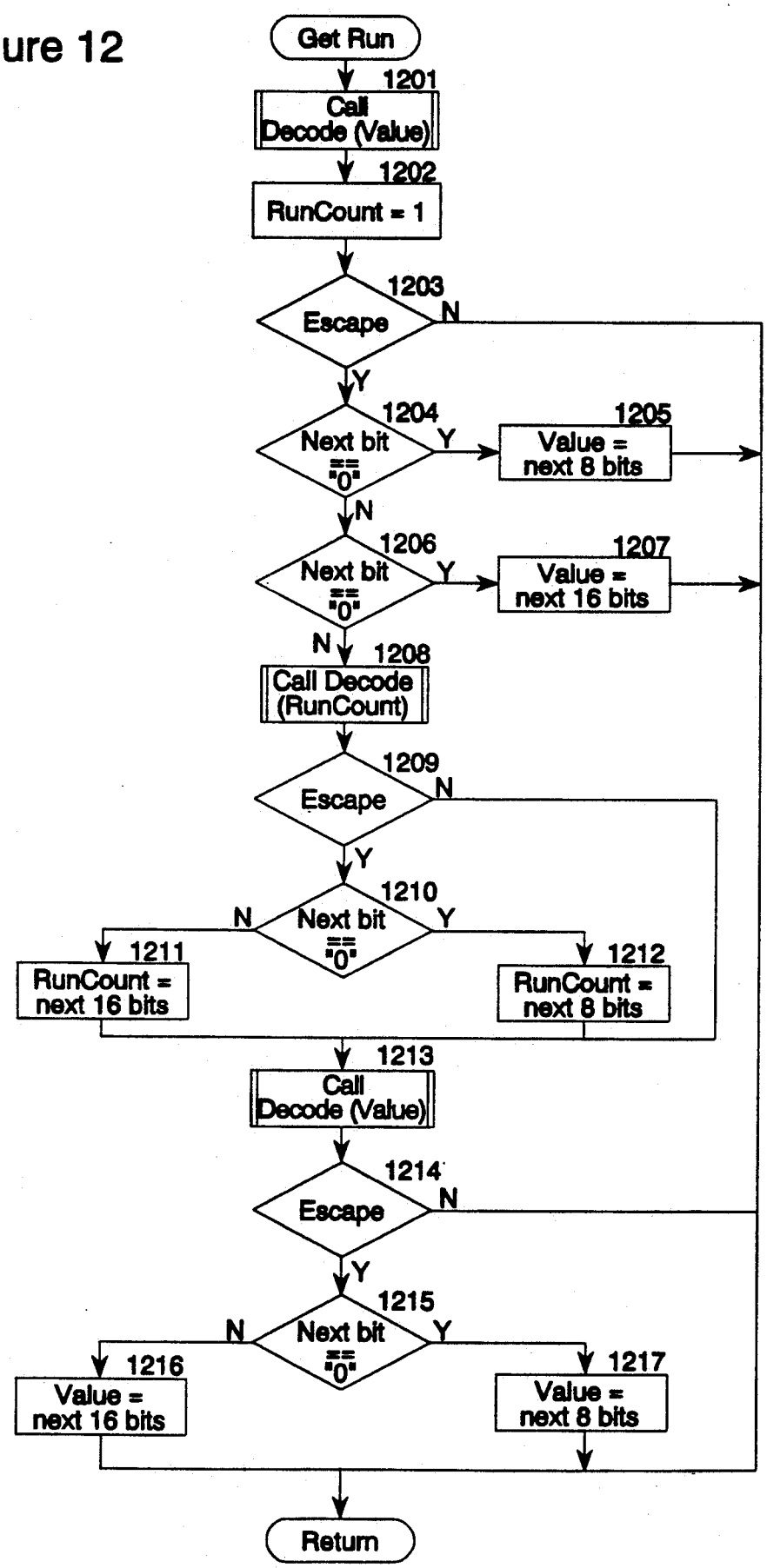
FIG. 12 is a flow diagram of the GetRun routine.

FIG. 12 is a flow diagram of the GetRun routine. Routine GetRun decodes the next run of delta values or next delta value if not a run and returns the delta value and run count. In block 1201, the routine calls routine Decode, which returns the next decoded value from array Source. In block 1202, the routine sets variable RunCount to 1. In blocks 1203 through 1207, the routine identifies and decodes 8-bit and 16-bit delta values. In block 1203, if variable Value is an escape symbol, then the routine continues at block 1204, else the variable Value contains a delta value and the routine returns. In block 1204, if the next bit in array Source is a 0, then an 8-bit delta value is encoded and the routine continues at block 1205, else the routine continues at block 1206. In block 1205, the routine sets variable Value to the next 8 bits in array Source and returns. In block 1206, if the next bit in array Source is a 0, then a 16-bit delta value is encoded and the routine continues at block 1207, else a run is encoded and the routine continues at block 1208. In block 1207, the routine sets variable Value to the next 16 bits in array Source and the routine returns. In block 1208, the routine call routine Decode to decode the run count. In block 1209, if the value returned by routine Decode is the escape symbol, then the run count is encoded in either 8 bits or 16 bits and the routine continues in block 1210, else the run count is not encoded and the routine continues in block 1213. The decode run count has 2 added to it to indicate the actual run length. In block 1210, if the next bit in array Source is a 0, then the run count is encoded in 8 bits and the routine continues at block 1212, else the run count is encoded in 16 bit and the routine continues at block 1211. In block 1211, the routine sets variable RunCount to the next 16 bits in array Source. In block 1212, the routine sets variable RunCount to the next 8 bits in array Source. In block 1213, the routine call routine Decode to decode the run value. In block 1214, if the value returned by routine Decode is an escape, then the run value is encoded in either 8 bits or 16 bits and the routine continues at block 1215, else the run value is not encoded and the routine returns. In block 1215, if the next bit in array Source is a 0, then the run value is encoded in 8 bits and the routine continues at block 1217, else the run value is encoded in 16 bits and the routine continues at block 1216. In block 1216, the routine sets variable Value to the next 16 bits in array Source and returns. In block 1217, the routine sets variable Value to the next 8 bits in array Source and returns.

Figure 13:
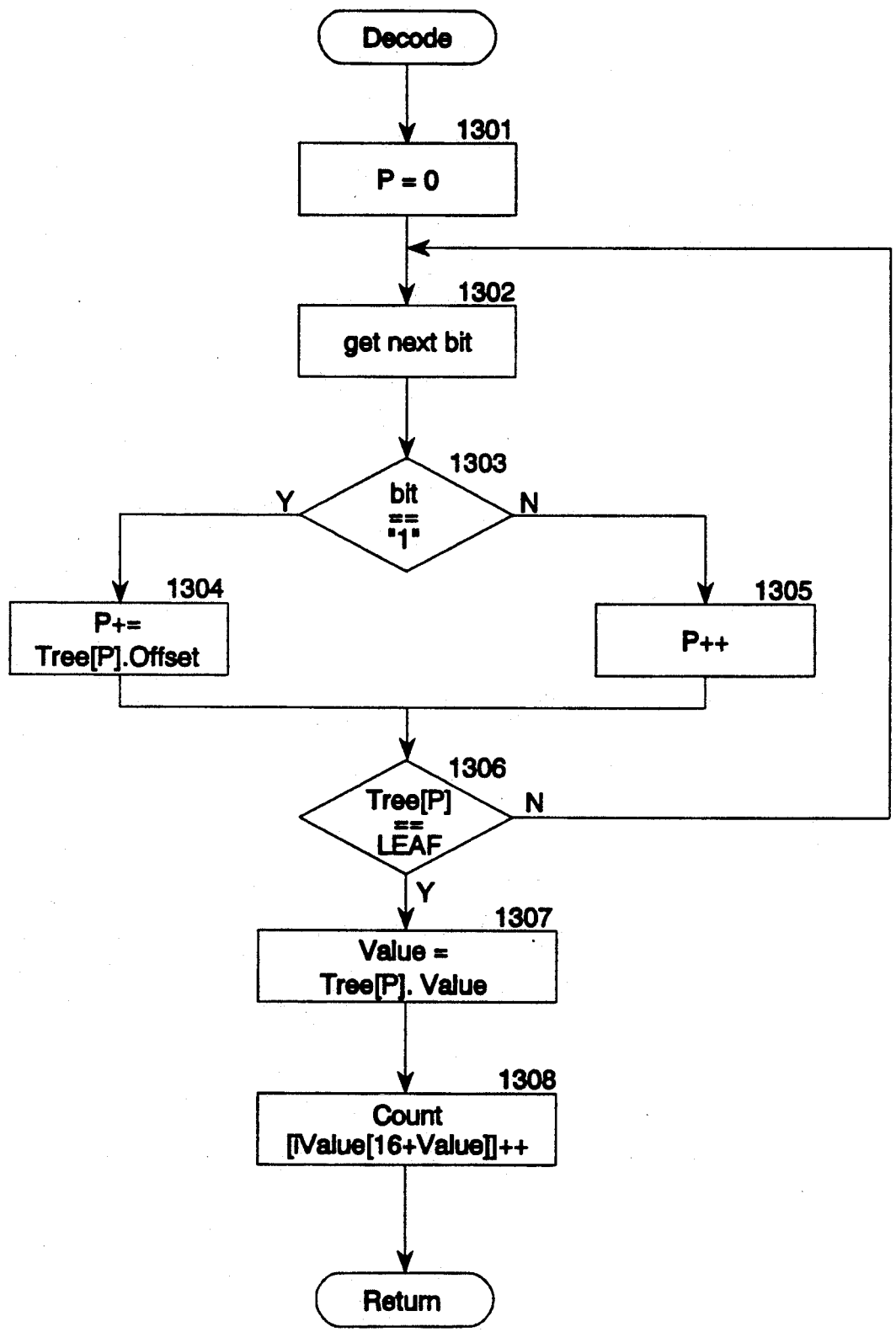
FIG. 13 is a flow diagram of the Decode routine.

FIG. 13 is a flow diagram of the Decode routine. Routine Decode returns the symbol value for the next encoded symbol in array Source using array Tree. In blocks 1301 through 1306, the routine searches array Tree for a leaf node. In block 1301, the routine sets index P to 0; index P indexes array Tree. In block 1302, the routine gets the next bit from array Source. In block 1303, if the bit is a 1, then a "1" branch is indicated and the routine continues at block 1304, else a "0" branch is indicated and the routine continues at block 1305. In block 1304, the routine adds array entry Tree[P].Offset to index P to follow the "1" branch. In block 1305, the routine increments index P to follow the "0" branch. In block 1306, if array entry Tree[P] is a leaf, then the value is decoded and the routine continues at block 1307, else the routine loops to block 1302 to get the next bit. In block 1307, the routine sets variable Value to array entry Tree[P].Value. In block 1308, the routine increment array entry Count[iValue[16+Value]] to track the frequency of the delta values and the routine returns.

Although the present invention has been described in terms of preferred embodiments, it is not intended that the invention be limited to these embodiments. Modifications within the spirit of the invention will be apparent to those skilled in the art. The scope of the present invention is defined by the claims that follow.

I claim:

1. A method in a computer system of compressing a plurality of packets of data values, the method comprising the steps of:
   defining a frequency table indicating frequencies of differences of data values; and
   for each of the plurality of packets,
   identifying a set of differences in the frequency table;
   generating a frequency-based encoding for each difference in the identified set based on the frequencies in the frequency table;
   calculating differences of adjacent data values in the packet;
   for each calculated difference, when the calculated difference is in the identified set, outputting the generated frequency-based encoding for the calculated difference, and when the calculated difference is not in the identified set, outputting the calculated difference in a format that is not frequency-based encoded, wherein output generated encodings and output calculated differences form a compressed packet of data values; and
   updating the frequency table based on calculated differences wherein subsequently generated frequency-based encodings are based on the updated frequency table.

2. The method of claim 1 including the step of when successive calculated differences are equal, outputting a run length encoding of the calculated differences, the run length encoding including an indicator of the number of equal calculated differences and the calculated difference.

3. The method of claim 2 including the step of when the identified set of differences includes a difference that is equal to the indicator of the number of equal calculated differences in the run length encoding, outputting the generated frequency-based encoding for the difference as the indicator of the number of equal calculated differences in the run length encoding.

4. The method of claim 3 including the step of when the identified set of differences does not include a difference that is equal to the indicator of the number of equal calculated difference in the run length encoding, outputting the indicator in a format that is not frequency-based encoded.

5. The method of claim 2 including the step of when the equal calculated difference of the run length encoding is in the identified set, outputting the generated frequency-based encoding for the equal calculated difference in the run length encoding.

6. A method of compressing a packet of data values, the method comprising the steps of:
   specifying a frequency distribution of data values;
   generating a frequency-based encoding for each data value based on the frequencies in the frequency table;
   when a set of successive data values are equal, outputting a run length encoding of the data values, the run length encoding including a run length indicator and the data value, the run length indicator being output as a generated frequency-based encoding for data value equal to the run length indicator;
   when successive data values are not equal, outputting the generated frequency-based encoding for the data values; and
   after generating the frequency based encoding, updating the frequency distribution of data values based on the frequency of data values in the packet wherein the updated frequency distribution is used when encoding another packet of data values.

7. The method of claim 6 including wherein the data value of the run length encoding is output as the generated frequency-based encoding for the data value.

8. A method in a computer system of compressing a plurality of packets of data values, the method comprising the steps of:
   defining a frequency table indicating frequencies of data values; and
   for each of the plurality of packets,
   identifying a set of data values in the frequency table;
   generating a frequency-based encoding for each data value in the identified set based on the frequencies in the frequency table;
   for each data value in the packet, when the data value is in the identified set, outputting the generated frequency-based encoding for the data value, and when the data value is not in the identified set, outputting the data value in a format that is not frequency-based encoded, wherein output generated encodings and output data values form a compressed packet of data values; and
   updating the frequency table based on frequency of data values in the packet wherein subsequently-generated frequency-based encodings are based on the updated frequency table.

9. The method of claim 8 including the step of when successive data values are equal, outputting a run length encoding of the equal data values, the run length encoding including an indicator of the number of equal data values and the data value.

10. The method of claim 9 including the step of when the identified set of data values includes a data value that is equal to the indicator of the number of equal data values in the run length encoding, outputting the generated frequency-based encoding as the equal data value in the run length encoding.

11. The method of claim 10 including the step of when the identified set of data values does not include a data value that is equal to the indicator of the number of equal data values in the run length encoding, outputting the indicator in a format that is not frequency-based encoded.

12. The method of claim 9 including the step of when the data value of the run length encoding is in the identified set, outputting the generated frequency-based encoding for the data value in the run length encoding.

13. A method in a computer system of compressing a plurality of packets of uncompressed data values into packets of compressed data values and decompressing the packets of compressed, data values, the method comprising the steps of:

defining a compression frequency table and a decompression frequency table indicating frequencies of data values;

for each of the plurality of packets of uncompressed data values, identifying a set of data values in the compression frequency table;

generating a frequency-based encoding for each data value in the identified set based on the frequencies in the compressed frequency table;

for each uncompressed data value in the packet, when the uncompressed data value is in the identified set, outputting the generated frequency-based encoding for the uncompressed data value; and when the uncompressed data value is not in the identified set, outputting the uncompressed data value in a format that is not frequency-based encoded, wherein output generated encodings and output data values form a packet of compressed data values; and updating the compression frequency table based on frequency of uncompressed data values in the packet; and for each packet of compressed data values, retrieving each generated encoding and each data value that is not in a frequency-based encoded format from the packet of compressed data values;

decoding the retrieved generated encoding using the decompression frequency table to generate an uncompressed data value, wherein the generated data values and the retrieved data values form a packet of decompressed data value; and updating the decompression frequency table based on frequency of data values in the packet of decompressed data values.

14. A computer system for compressing a plurality of packets of data values comprising:

a frequency table indicating frequencies of data values;

means for identifying a set of values in the frequency table;

means for generating a frequency-based encoding for each data value in the identified set based on the frequencies in the frequency table;

means for retrieving a data value from a packet;

means for outputting the generated frequency-based encoding for the retrieved data value when a retrieved data value is in the identified set, means for outputting the retrieved data value in a format that is not frequency-based encoded when the retrieved data value is not in the identified set;

means for storing the output generated encodings and output data values as a packet of compressed data values; and means for updating the frequency table based on frequency of data values in one of the plurality of packets.

15. The computer system of claim 14 including means for outputting a run length encoding of retrieved data values when successive retrieved data values are equal, the run encoding including an indicator of the number of equal data values and the equal data value.

16. The computer system of claim 15 including means for outputting a generated frequency-based encoding in the run length encoding when the identified set of data values includes a data value that is equal to the indicator of the number of data values in the run length encoding.

17. The computer system of claim 16 including means for outputting the indicator in a format that is not frequency-based encoded when the identified set of data values does not include a data value that is equal to the indicator of the number of data values in the run length encoding.

18. The computer system of claim 15 including means for outputting the generated frequency-based encoding for the equal data value in the run length encoding when the equal data value of the run length encoding is in the identified set.

* * * * *

UNITED STATES PATENT AND TRADEMARK OFFICE
CERTIFICATE OF CORRECTION

PATENT NO. : 5,260,693
DATED : November 9, 1993
INVENTOR(S) : Erik R. Horsley

It is certified that error appears in the above-indentified patent and that said Letters Patent is hereby corrected as shown below:

In column 15, claim 13, line 28, please delete "compressed" and substitute therefor --compression--.

In column 16, claim 14, line 10, after "set of" and before "values" please insert --data--.

In column 16, claim 15, line 31, after "the run" and before "encoding" please insert --length--.

Signed and Sealed this

Thirty-first Day of May, 1994

Attest:

BRUCE LEHMAN

Attesting Officer     Commissioner of Patents and Trademarks